(12) United States Patent
Hori (10) Patent No.: US 6,389,083 B1
(45) Date of Patent: May 14, 2002

(54) TRELLIS DECODER

(75) Inventor: Michiru Hori, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/231,903

(22) Filed: Jan. 14, 1999

(30) Foreign Application Priority Data

Aug. 27, 1998 (JP) .......................................... 10-242087

(51) Int. Cl.$^7$ .............................................. H04L 27/06
(52) U.S. Cl. ...................................... 375/341; 714/795
(58) Field of Search ................................ 375/261, 262, 375/265, 341; 714/794, 786, 792, 795

(56) References Cited

U.S. PATENT DOCUMENTS

| | | | |
|---|---|---|---|
| 5,651,032 A | | 7/1997 | Okita |
| 5,909,454 A | * | 6/1999 | Schmidt ..................... 371/43.2 |
| 6,078,625 A | * | 6/2000 | McCallister et al. ........ 375/261 |
| 6,138,265 A | * | 10/2000 | Morelos-Zaragoza et al. ... 714/792 |
| RE36,980 E | * | 12/2000 | Kim et al. ................... 348/608 |
| 6,160,854 A | * | 12/2000 | Heegard et al. ............. 375/265 |
| 6,236,685 B1 | * | 5/2001 | Oppedahl ................... 375/265 |

FOREIGN PATENT DOCUMENTS

JP          7-131493          5/1995

OTHER PUBLICATIONS

"Introduction to Digital Television", by Andrew J. King, ISSCC Short Course, Feb. 6, 1996.

* cited by examiner

Primary Examiner—Chi Pham
Assistant Examiner—Emmanuel Bayard
(74) Attorney, Agent, or Firm—McDermott, Will & Emery (57) ABSTRACT

A Trellis decoder in which a demodulated signal is handled by dividing into four areas for eight symbols, namely a pre-circuit obtains a 3-bit sign according to a high-order 4-bit sign in the demodulated signal; an area determining circuit identifies any of the four areas by obtaining a 2-bit sign in the 3-bit output from the pre-circuit; a delay circuit delays the 2-bit output from the area determining circuit and a sign for the MSB in the demodulated signal; and a selection circuit identifies a value of a high-order two bits in a received symbol according to the 2-bit output of the area determining circuit, the MSB in the demodulated signal, and an estimated value of the LSB in the received symbol outputted by a convolutional coder.

5 Claims, 8 Drawing Sheets

| SYMBOL | DEMODULATION SIGNAL | PRE-CIRCUIT OUTPUT | AREA DETERMINING CIRCUIT OUTPUT | SELECTION CIRCUIT OUTPUT |
|---|---|---|---|---|
| 011 | 011 1111<br>011 1110<br>⌇<br>011 1001<br>011 1000<br>011 0111<br>⌇<br>011 0001<br>011 0000 | 111<br>111<br>\|<br>111<br>111<br>110<br>\|<br>110<br>110 | 11<br>11<br>\|<br>11<br>11<br>11<br>\|<br>11<br>11 | 01 |
| 010 | 010 1111<br>010 1110<br>⌇<br>010 1001<br>010 1000 | 101<br>101<br>\|<br>101<br>101 | 11<br>11<br>\|<br>11<br>11 | 01 |
|  | 010 0111<br>⌇<br>010 0001<br>010 0000 | 100<br>\|<br>100<br>100 | 10<br>\|<br>10<br>10 | 01 |
| 001 | 001 1111<br>001 1110<br>⌇<br>001 1001<br>001 1000 | 011<br>011<br>\|<br>011<br>011 | 10<br>10<br>\|<br>10<br>10 | 00 |
|  | 001 0111<br>⌇<br>001 0001<br>001 0000 | 010<br>\|<br>010<br>010 | 01<br>\|<br>01<br>01 | 00 |
| 000 | 000 1111<br>000 1110<br>⌇<br>000 1001<br>000 1000 | 001<br>001<br>\|<br>001<br>001 | 01<br>01<br>\|<br>01<br>01 | 00 |
|  | 000 0111<br>⌇<br>000 0001<br>000 0000 | 000<br>\|<br>000<br>000 | 00<br>\|<br>00<br>00 | 00 |

FIG.6

| SYMBOL | DEMODULATION SIGNAL | PRE-CIRCUIT OUTPUT | AREA DETERMINING CIRCUIT OUTPUT | SELECTION CIRCUIT OUTPUT |
|---|---|---|---|---|
| 111 | 111 1111<br>111 1110<br>⁀<br>111 1001<br>111 1000 | 000<br>000<br>\|<br>000<br>000 | 00<br>00<br>\|<br>00<br>00 | 11 |
|  | 111 0111<br>⁀<br>111 0001<br>111 0000 | 000<br>\|<br>001<br>001 | 01<br>⁀<br>01<br>01 | 11 |
| 110 | 110 1111<br>110 1110<br>⁀<br>110 1001<br>110 1000 | 010<br>010<br>\|<br>010<br>010 | 01<br>01<br>\|<br>01<br>01 | 11 |
|  | 110 0111<br>⁀<br>110 0001<br>110 0000 | 011<br>\|<br>011<br>011 | 10<br>⁀<br>10<br>10 | 11 |
| 101 | 101 1111<br>101 1110<br>⁀<br>101 1001<br>101 1000 | 100<br>100<br>\|<br>100<br>100 | 10<br>10<br>\|<br>10<br>10 | 10 |
|  | 101 0111<br>⁀<br>101 0001<br>101 0000 | 101<br>\|<br>101<br>101 | 11<br>⁀<br>11<br>11 | 10 |
| 000 | 100 1111<br>100 1110<br>⁀<br>100 1001<br>100 1000<br>100 0111<br>⁀<br>100 0001<br>100 0000 | 110<br>110<br>\|<br>110<br>110<br>111<br>\|<br>111<br>111 | 11<br>11<br>\|<br>11<br>11<br>11<br>\|<br>11<br>11 | 10 |

TRELLIS DECODER

FIELD OF THE INVENTION

The present invention relates to a Trellis decoder in a trellis coding modulation system, and more particularly to a Trellis decoder used especially in a QAM modulation/demodulation system for concurrently changing the amplitude and the phase.

BACKGROUND OF THE INVENTION

In a multilevel QAM modulation/demodulation system, an error may occur in a signal after the QAM demodulation due to noise or reflection generated in a transmission path during signal transmission. Therefore, a transmission signal is subjected to coding for error correction for transmission at a transmitting side.

As for a multilevel QAM symbol in the multilevel QAM modulation/demodulation system, each symbol in the I axis and Q axis is expressed with an X bit such as "Ix–1 Ix–2 . . . Ix–1 Ix0, Qx–1 Qx–2 . . . Qx1 Qx0" (any of "Ix–1", "Ix–2", "Ix1", "Ix0", "Qx–1", "Qx–2", "Qx1" and "Qx0" is either "0" or "1"). The transmitting side of the multilevel QAM modulation/demodulation system subjects a signal to multilevel QAM modulation and transmits the modulated signals by allocating data subjected to convolutional coding to "Ix0" and "Qx0" both of which are the least significant bits (described LSB hereinafter) in the multilevel QAM symbols and also allocating data not being subjected to convolutional coding to a part of high-order "X–1" bits in the "Ix–1" to "Ix1" bits and in the "Qx–1" to "Qx1" bits excluding the LSBs in the symbols in the I axis and Q axis.

A receiving side subjects a received signal to multilevel QAM demodulation to obtain a demodulated signal, inputs the signal into a Trellis decoder and corrects an error therefor, and estimates a QAM symbol transmitted at the transmitting side. The demodulated signal in the I axis and Q axis is an N-bit soft decision signal respectively. A part of the high-order "X" bits in the signal represents an estimated value of the QAM symbol, and a part of the low-order "N–X" bit excluding the part of high-order "X" bit represents an error from each of the QAM symbols in the I axis and Q axis respectively.

The Trellis decoder generally comprises a delay circuit of a Viterbi decoder, an area determining circuit or a RAM; a selection circuit; a convolutional coder; and a demapper. Error correction for each "N–X+1" bit in a demodulated signal corresponding to the LSB in each of the QAM symbols in the I axis and Q axis is executed in the Viterbi decoder. Error correction for a part of a high-order "X–1" bit in each of the QAM symbols is executed by using each estimated value of the LSB in each of the QAM symbols obtained by re-coding a result of error correction with the Viterbi decoder by the convolutional coder. A sign of each part of the high-order "X–1" bit in each of the QAM symbols is delayed in the delay circuit and inputted into the selection circuit. With the operation, phases between signs of the parts of high-order "X–1" bits in the QAM symbols and estimated values of the LSBs in the QAM symbols are correlated in the selection circuit.

Figure 8:
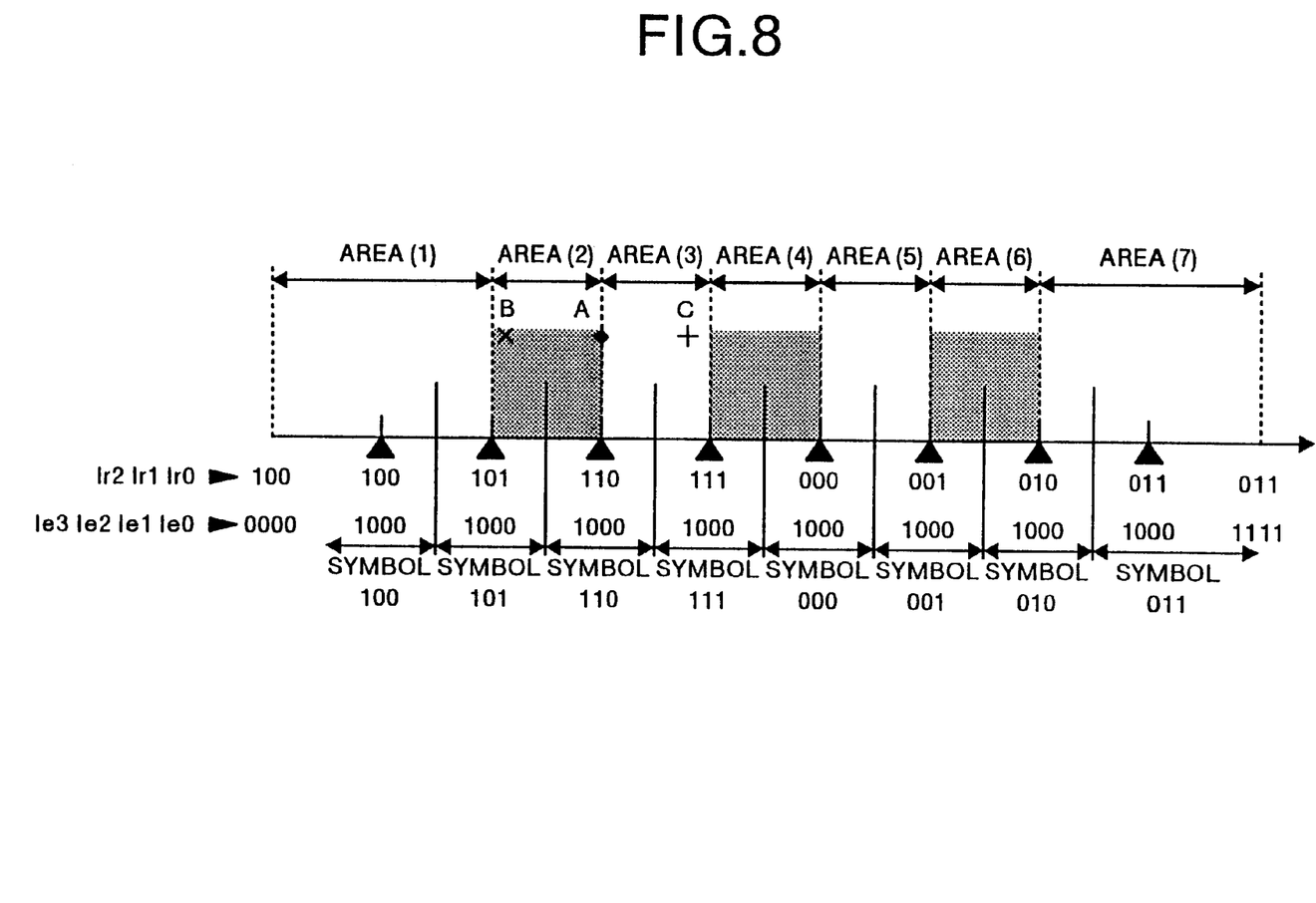
FIG. 8 is a simulated view showing a correlation between 64QAM-demodulated signals and QAM symbols based on the conventional technology.

FIG. 8 is a simulated view showing a correlation between 64QAM modulated signals and QAM symbols in the I axis for explaining conventional type of error correction for QAM symbols. In FIG. 8, 64QAM symbols are expressed with "I2 I1 I0", and demodulated signals Ir in the I axis are expressed with "Ir2 Ir1 Ir0 Ie3 Ie2 Ie1 Ie0", which are expressed with complement numbers of two. A correlation between 64QAM modulated signals and QAM symbols in the Q axis is the same as described above. It is assumed that, when the transmitting side sends a symbol A "110" (mark ♦ in FIG. 8) and the receiving side demodulates the symbol, an error occurs in the demodulated signal due to noise in the transmission path so that a demodulated signal B "101xxxx" (mark × in FIG. 8) or a demodulated signal C "111xxxx" (mark + in FIG. 8) are obtained. The mark x in the signals represents either "0" or "1".

(1) Error Correction for Demodulated Signal B "101xxxx"

Even if a value obtained by re-coding a result of error correction by the Viterbi decoder with the convolutional coder is "0", the high-order two bits in the demodulated signal are still "10", and hence, the demodulated signal can not be corrected to the transmitted symbol A "110". Therefore, when a demodulated signal is the demodulated signal B, the area determining circuit needs to output four bits of "10" and "11" in case where the LSBs in the QAM symbols are "1" and "0". The selection circuit corrects, when the LSB at the symbol point is "0", an error for the high-order two bits in the demodulated signal by selecting output "11" from the area determining circuit.

(2) Error Correction for Demodulated Signal C "111xxxx"

Even if a value obtained by re-coding a result of error correction by the Viterbi decoder with the convolutional coder is either "0" or "1", the high-order two bits in the demodulated signal are still "11". Therefore, when a demodulated signal is the demodulated signal C, the area determining circuit needs to output four bits of "11" and "11" in case where the LSBs in the QAM symbols are "1" and "0".

Description below provides a summary of results of output from the area determining circuit and selection circuit based on the conventional technology.

(1) When a demodulated signal is in a range from "1000000" to "1010111" (Area (1) in FIG. 8), the area determining circuit outputs "10" and "10", and the selection circuit outputs "10" and "10" when the LSBs therein are "0" and "1" respectively.

(2) When a demodulated signal is in a range from "1011000" to "1100111" (Area (2) in FIG. 8), the area determining circuit outputs "11" and "10", and the selection circuit outputs "11" and "10" when the LSBs therein are "0" and "1" respectively.

(3) When a demodulated signal is in a range from "1101000" to "1110111" (Area (3) in FIG. 8), the area determining circuit outputs "11" and "11", and the selection circuit outputs "11" and "11" when the LSBs therein are "0" and "1" respectively.

(4) When a demodulated signal is in a range from "1111000" to "1111111" and from "0000000" to "0000111" (Area (4) in FIG. 8), the area determining circuit outputs "00" and "11", and the selection circuit outputs "00" and "11" when the LSBs therein are "0" and "1" respectively.

(5) When a demodulated signal is in a range from "0001000" to "0010111" (Area (5) in FIG. 8), the area determining circuit outputs "00" and "00", and the selection circuit outputs "00" and "00" when the LSBs therein are "0" and "1" respectively.

(6) When a demodulated signal is in a range from "0011000" to "0100111" (Area (6) in FIG. 8), the area determining circuit outputs "00" and "00", and the selection circuit outputs "01" and "00" when the LSBs therein are "0" and "1" respectively.

(7) When a demodulated signal is in a range from "0101000" to "0111111" (Area (7) in FIG. 8), the area determining circuit outputs "01" and "01", and the selection circuit outputs "01" and "01" when the LSBs therein are "0" and "1" respectively.

In the conventional type of Trellis decoder, however, when an error is to be corrected for a part of a high-order "X−1" bit in a QAM symbol, "(X−1)×4" bits in I and Q axis respectively, total "(X−1)×2" bits, are required as an output from the area determining circuit.

Therefore, a size of a delay circuit of a RAM or the like into which output from the area determining circuit is inputted is "(X−1)×4 bits×m". Herein m indicates a delay after a value at the "N−X+1" bit from the high order bit in the demodulated signal is inputted into a Trellis decoder until the value is re-coded. For example, in a case of 64QAM, the area determining circuit outputs a 4-bit sign for each of the axes as described above, so that a 8-bit sign as a total of the signs in the Q axis and I axis will be inputted into the delay circuit. Therefore, conventionally, a scale of a delay circuit has been "8 bits×m words".

The delay m depends on a length of truncation of a sign by a Viterbi decoder, and the length of truncation of a sign needs a length five to seven times as long as that of a convolutional code to be bound. Input to the delay circuit depends on a multilevel-number in a QAM symbol. All these facts indicate that the size of the delay circuit becomes bigger in association with a longer length of a convolutional code to be bound, and also becomes bigger in association with a larger multilevel-number in a QAM symbol, which makes the scale of the circuit of a Trellis decoder bigger.

SUMMARY OF THE INVENTION

It is an object of the present invention to obtain, for solving the problems described above, a Trellis decoder in which scale of the circuit as a whole is as small as possible through a step of decreasing a number of elements for a delay circuit as small as possible by reducing a number of input bits to the delay circuit as small as possible.

With the present invention, a pre-circuit outputs a sign expressed with X bits according to a sign in the high-order "X+1"-bit of a demodulated signal; an area determining circuit outputs a sign expressed with "X−1" bits according to the X-bit sign outputted from the pre-circuit; and a delay circuit receives the "X−1-bit sign outputted from the area determining circuit and a sign for the most significant bit (described MSB hereinafter) in the demodulated signal and then delays a sign for the X bits as a total of the bits above and outputs the sign into a selection circuit. On the other hand, a Viterbi decoder corrects an error for a value of the LSB in a received symbol; a convolutional coder re-codes the value according to a result of error correction by the Viterbi decoder, obtains an estimated value of the LSB in the received symbol through the operation, and outputs the value to the selection circuit. The selection circuit receives a sign obtained by synchronizing the "X−1"-bit sign from the area determining circuit as well as the sign for the MSB in the received symbol each outputted from the delay circuit and the estimated sign for the LSB in the received symbol outputted from the convolutional coder to each other, and identifies a value of a high-order "X−1"-bit sign in the received symbol according to the signs.

With the present invention, a pre-circuit outputs a 3-bit sign according to a sign in the high-order 4-bit of the demodulated signal; an area determining circuit outputs a 2-bit sign according to the 3-bit sign outputted from the pre-circuit; and a delay circuit receives the 2-bit sign outputted from the area determining circuit and a sign for the MSB in the demodulated signal, delays a 3-bit sign as a total of the bits above, and outputs the sign to a selection circuit. On the other hand, a Viterbi decoder corrects an error for a value of the LSB in a received symbol; a convolutional coder re-codes the value according to a result of error correction by the Viterbi decoder, obtains an estimated value of the LSB in the received symbol through the operation, and outputs the value to the selection circuit. The selection circuit receives a sign obtained by synchronizing the 2-bit sign from the area determining circuit as well as the sign for the MSB in the received symbol each outputted from the delay circuit, and the estimated sign for the LSB in the received symbol outputted from the convolutional coder to each other, and identifies a value of a high-order 2-bit sign in the received symbol according to the signs.

With the present invention, a pre-circuit outputs a 3-bit sign according to a demodulated signal.

With the present invention, an area determining circuit outputs "00" when a demodulated signal is in arrange from "0000000" to "0000111" or from "1111000" to "1111111", outputs "01" when a demodulated signal is in a range from "0001000" to "0010111" or from "1101000" to "1110111", outputs "10" when a demodulated signal is in a range from "0011000" to "0100111" or from "1011000" to "1100111" and outputs "11" when a demodulated signal is in a range from "0101000" to "1010111".

With the present invention, a selection circuit corrects an error for a value and identifies a high-order 2-bit sign in a received symbol according to the output from the area determining circuit, the MSB in the received symbol and the estimated sign for the LSB in the received symbol obtained through re-coding by the convolutional coder.

Other objects and features of this invention will become apparent from the following description with reference to the accompanying drawings.

DESCRIPTION OF THE PREFERRED EMBODIMENT

Figure 1:
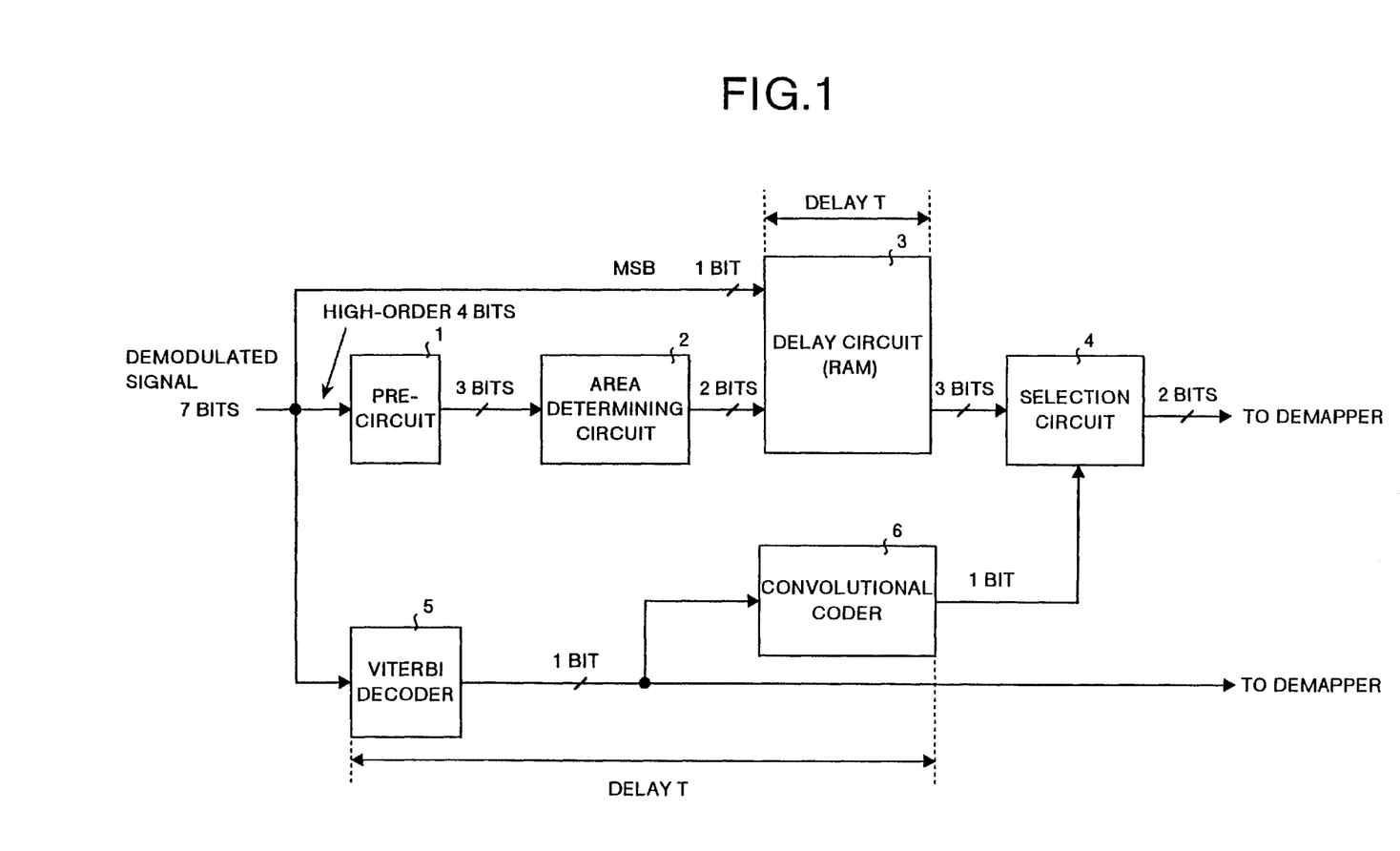
FIG. 1 is a block diagram showing an example of the Trellis decoder according to the present invention.

Detailed description is made hereinafter for the preferred embodiment of the Trellis decoder according to the present invention with reference to the related drawings. FIG. 1 is a block diagram showing an example of the Trellis decoder according to the present invention, and the figure is an explanation for only the I axis. In all the figures and the description below, explanation is made for only the I axis. Since the explanation for Q axis is the same as that for the I axis, description thereof is omitted herein.

This Trellis decoder comprises an area determining circuit 2, a delay circuit 3 comprising a RAM, a selection circuit 4, a Viterbi circuit 5, a convolutional coder 6, and a demapper which is not shown in the figure. In addition to these components, which are the same as for the conventional type of decoder, a pre-circuit 1 is provided in the upstream side of the area determining circuit 2.

For example, in a case of 64QAM, high-order 4 bits in a 7-bit demodulated signal are inputted into the pre-circuit 1. The pre-circuit 1 generates and outputs a 3-bit sign according to the received 4-bit sign. The area determining circuit 2 generates and outputs a 2-bit sign according to the 3-bit sign received from the pre-circuit 1. The 2-bit sign outputted from the area determining circuit 2 is inputted into the delay circuit 3 together with a sign for the MSB in the demodulated signal corresponding to the MSB in a received symbol. The 3-bit sign as a total of the bits received by the delay circuit is delayed here by the period T, and outputted to the selection circuit 4.

On the other hand, the demodulated signal is inputted into the Viterbi decoder 5, and the Viterbi decoder 5 corrects an error for a value of a sign for the LSB in the received symbol according to the received signal. The convolutional coder 6 obtains an estimated value of the sign for the LSB in the received symbol, by re-coding the sign according to the result of error correction by the Viterbi decoder 5, and outputs the value to the selection circuit 4. The time T is required for the operation since the demodulated signal is received by the Viterbi decoder 5 until the estimated value of the sign for the LSB in the received symbol is outputted from the convolutional circuit 6. Accordingly, in the selection circuit 4 is inputted, the estimated sign for the LSB in the received symbol outputted from the convolutional circuit 6 in synchronism to the 2-bit sign as output from the area determining circuit 2 as well as to the sign for the MSB in the demodulated signal each outputted from the delay circuit 3.

The selection circuit 4 identifies a high-order 2-bit sign in the received symbol according to the estimated sign for the LSB in the received symbol, 2-bit sign as output from the area determining circuit and the sign for the MSB in the demodulated signal, and outputs the identified sign to a demapper which is not shown in the figure. The result of error correction by the Viterbi decoder 5 is also inputted into the demapper.

Figure 2:
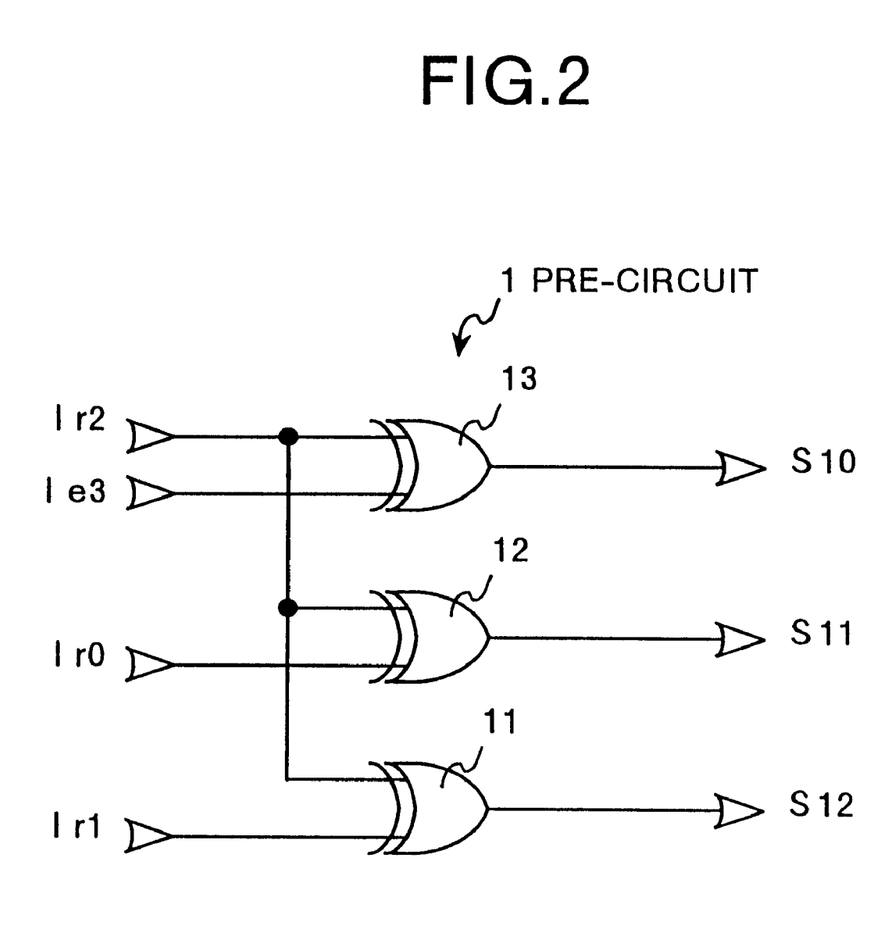
FIG. 2 is a circuit diagram showing an embodiment of a pre-circuit for the Trellis decoder.

FIG. 2 is a circuit diagram showing an embodiment of the pre-circuit 1. The pre-circuit 1 comprises three XOR gates 11, 12 and 13 for executing XOR operation. Assuming that a demodulated signal Ir is "Ir2 Ir1 Ir0 Ie3 Ie2 Ie1 Ie0" each of which expresses a bit with a complement number of two, and a 3-bit signal outputted from the pre-circuit 1 is expressed with "S12 S11 S10" each of which expresses a bit with a complement number of two, the first XOR gate 11 receives the signal "Ir2" corresponding to the MSB and the signal "Ir1" corresponding to the second bit from the high order bit in the demodulated signal, and outputs the signal S12 corresponding to the MSB in the three bits outputted from the pre-circuit 1.

The second XOR gate 12 receives the signal "Ir2" and the signal "Ir0" corresponding to the third bit from the high order bit in the demodulated signal, and outputs the signal S11 corresponding to the second bit from the high order bit in the three bits outputted from the pre-circuit 1.

The third XOR gate 13 receives the signal "Ir2" and the signal "Ie3" corresponding to the fourth bit from the high order bit in the demodulated signal, and outputs the signal S10 corresponding to the LSB in the three bits outputted from the pre-circuit 1.

Figure 3:
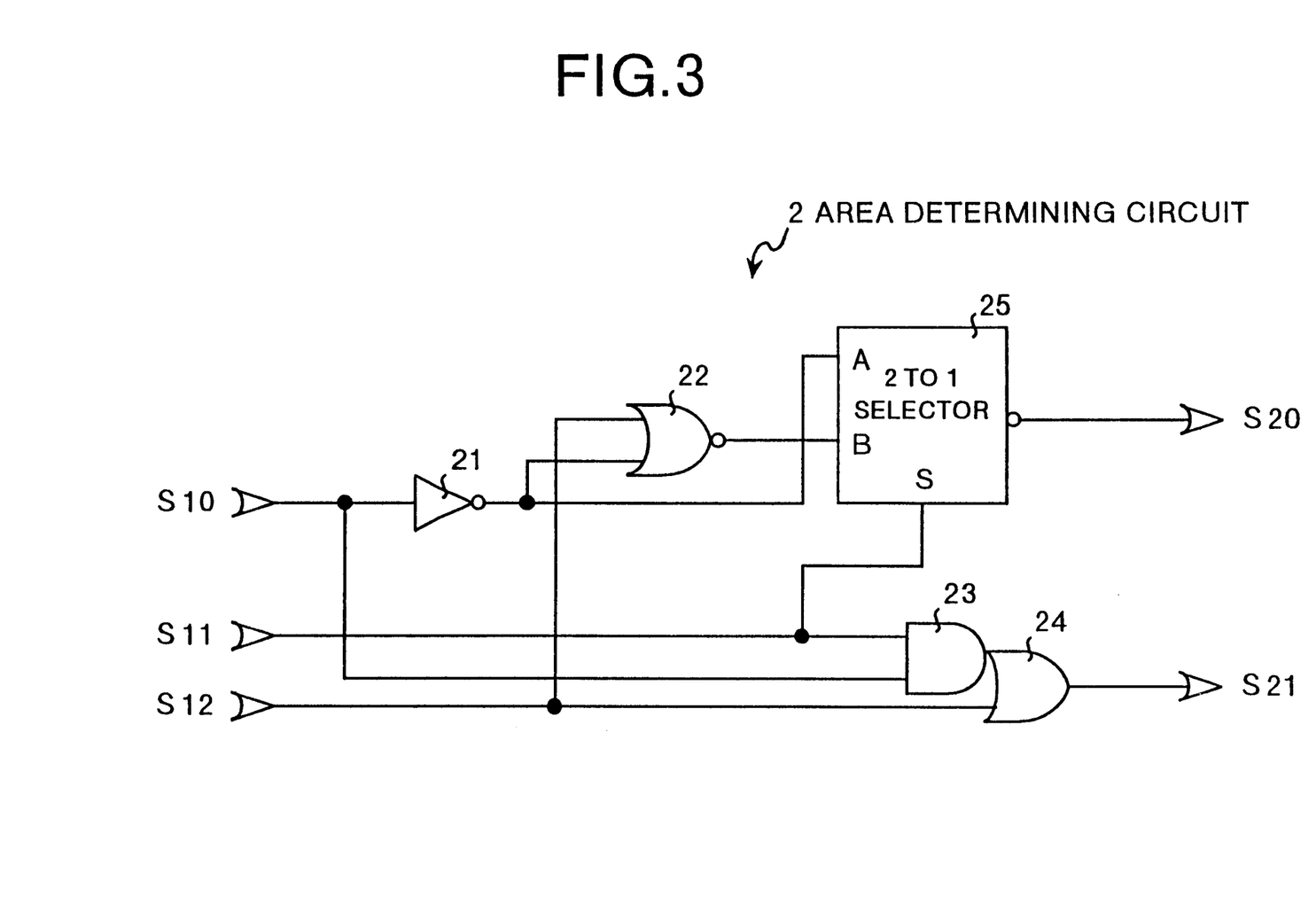
FIG. 3 is a circuit diagram showing an embodiment of a area determining circuit for the Trellis decoder.

FIG. 3 is a circuit diagram showing an embodiment of the area determining circuit 2. This area determining circuit 2 comprises a NOT gate 21, a NOR gate 22, an AND gate 23, an OR gate 24 and a 2 to 1 selector (selection circuit) 25. The NOT gate 21 receives "S10" corresponding to the LSB in the 3-bit output signal from the pre-circuit 1, inverts the signal, and outputs the inverted signal to one of the input terminals of the NOR gate 22 as well as to one of the input terminals (described a terminal A hereinafter) of the 2 to 1 selector 25.

The NOR gate 22 receives "S12" corresponding to the MSB in the 3-bit output signal from the pre-circuit 1 at the other input terminal, inverts a logical sum of the two inputs, and outputs the inverted signal to the other input terminal (described a terminal B hereinafter) of the 2 to 1 selector 25.

The 2 to 1 selector 25 receives "S11" corresponding to the center bit in the 3-bit output signal from the pre-circuit 1 at a terminal S of the selector, outputs an inverted signal of the input signal at the terminal A when the input signal at the terminal S is "0", and outputs an inverted signal of the input signal at the terminal B when the input signal at the terminal S is "1". An output signal from this 2 to 1 selector 25 is a signal "S20" corresponding to the LSB when the 2-bit signal outputted from the area determining circuit 2 is expressed with "S21 S20" each of which expresses a bit with a complement number of two.

The AND gate 23 receives "S11" corresponding to the center bit and "S10" corresponding to the LSB in the 3-bit output signal from the pre-circuit 1, and outputs a logical product of the two inputs to one of input terminals of the OR gate 24.

The OR gate 24 receives "S12" corresponding to the MSB in the 3-bit output signal from the pre-circuit 1 at the other input terminal, and outputs a logical sum of the two inputs as a signal "S21" corresponding to the MSB in the 2-bit output signal "S21 S20" from the area determining circuit 2.

Figure 4:
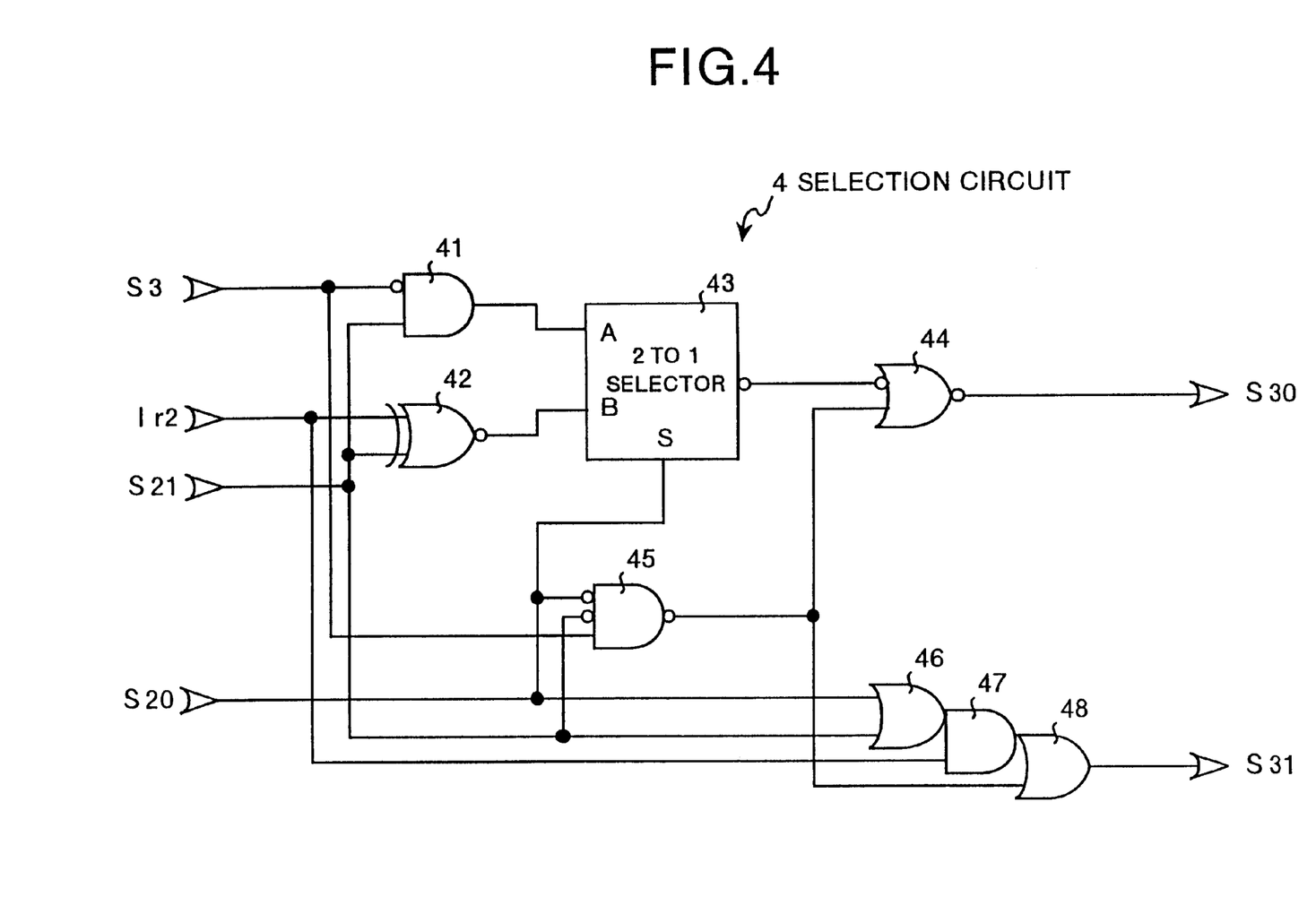
FIG. 4 is a circuit diagram showing an embodiment of a selection circuit for the Trellis decoder.

FIG. 4 is a circuit diagram showing an embodiment of the selection circuit 4. This selection circuit 4 comprises three AND gates 41, 45, 47; a XOR gate 42; a 2 to 1 selector 43; and three OR gates 44, 46 and 48. The AND gate 41 receives "S21" corresponding to the MSB in the 2-bit output signal from the area determining circuit 2 and an inverted signal of 1-bit "S3" outputted from the convolutional coder 6, and outputs a logical product of the two inputs to the terminal A of the 2 to 1 selector 43.

The XOR gate 42 receives "Ir2" corresponding to the MSB in the demodulated signal and "S21" corresponding to the MSB in the 2-bit output signal from the area determining circuit 2, and outputs an XOR of the two inputs to the terminal B of the 2 to 1 selector 43.

The 2 to 1 selector 43 receives "S20" corresponding to the LSB in the 2-bit output signal from the area determining circuit 2 at terminal S, and outputs an inverted signal of the input signal at the terminal A when the input signal at the terminal S is "0", and outputs an inverted signal of the input signal at the terminal B when the input signal at the terminal S is "1". An output signal from this 2 to 1 selector 43 is inverted and inputted to one of input terminals of the OR gate 44.

The AND gate 45 has three input terminals and receives bits of "S20" and "S21" in the 2-bit output signal from the area determining circuit 2 each having been inverted, also receives bit "S3" from the convolutional coder 6, and outputs a logical product of the three inputs to the other input terminal of the OR gate 44.

The OR gate 44 outputs a logical sum of the two inputs as a signal "S30" corresponding to the LSB in the 2-bit output signal "S31 S30" from the selection circuit 4.

The OR gate 46 receives bits "S20" and "S21" in the 2-bit output signal from the area determining circuit 2, and outputs a logical sum of the two inputs to one of input terminals of the AND gate 47.

The AND gate 47 receives "Ir2" corresponding to the MSB in the demodulated signal at the other input terminal of the gate, and outputs a logical product of the two inputs to one of input terminals of the OR gate 48.

The OR gate 48 receives output from the AND gate 45 at the other input terminal, and outputs a logical sum of the two inputs as a signal "S31" corresponding to the MSB in the 2-bit output signal "S31 S30" from the selection circuit 4.

Figure 5:
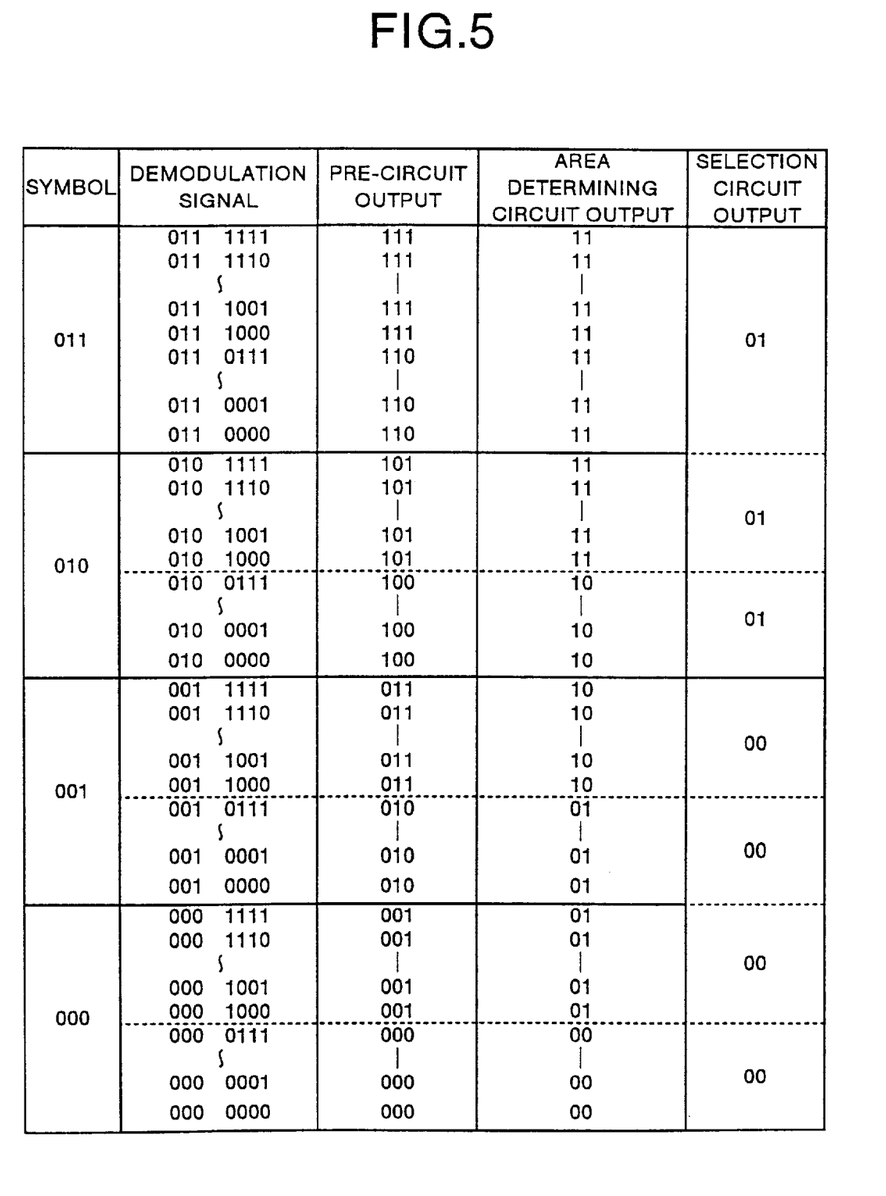
FIG. 5 is a view showing a correlation between input and output in the pre-circuit, area determining circuit and selection circuit.
Figure 6:
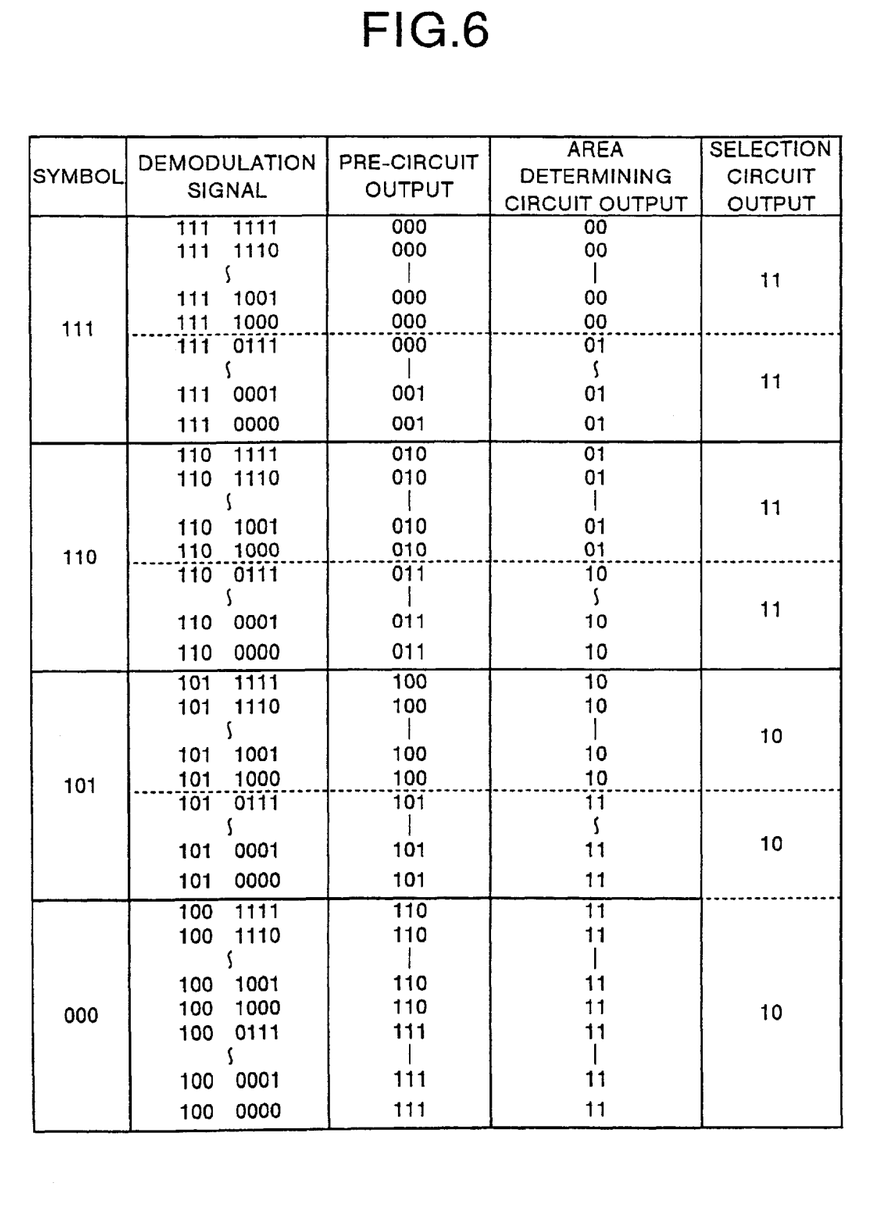
FIG. 6 is a view showing a correlation between input and output in the pre-circuit, area determining circuit and selection circuit.

Next, description is made for effects of the pre-circuit 1, area determining circuit 2 and the selection circuit 4 with reference to FIG. 5 and FIG. 6. FIG. 5 and FIG. 6 each show a correlation between input and output in the pre-circuit 1, area determining circuit 2 and the selection circuit 4.

As shown in the figures, the pre-circuit 1 outputs (1) "000" when "Ir2 Ir1 Ir0 Ie3" as high-order 4 bits in a demodulated signal is "0000" or "1111", (2) "001" when "Ir2 Ir1 Ir0 Ie3" is "0001" or "1110", (3) "010" when "Ir2 Ir1 Ir0 Ie3" is "0010" or "1101", (4) "011" when "Ir2 Ir1 Ir0 Ie3" is "0011" or "1100", (5) "100" when "Ir2 Ir1 Ir0 Ie3" is "0100" or "1011", (6) "101" when "Ir2 Ir1 Ir0 Ie3" is "0101" or "1010", (7) "111" when "Ir2 Ir1 Ir0 Ie3" is "1001" or "1001", and (8) "111" when "Ir2 Ir1Ir0 Ie3" is "0111" or "1000".

The area determining circuit 2 outputs (1) "00" when "S12 S11 S10" as the output from the pre-circuit 1 is "000", (2) "01" when "S12 S11 S10 is "001" or "010", (3) "10" when "S12 S11 S10" is "011" or "100", and (4) "11" when "S12 S11 S10" is "101", "110" or "111".

The selection circuit 4 outputs (1) "00" even if output "S3" from the convolutional coder 6 is "0" or "1" when "S21 S20" as output from the area determining circuit 2 is "00" or "01" and the MSB in a demodulated signal (namely, the MSB in a received symbol) "Ir2" is "0"; (2) "11" even if "S3" is ""0" or "1" when "S21 S20" is "00" or "01" and "Ir2" is "1"; (3) "00" when "S21 S20" is "10", "Ir2" is "0" and "S3" is "1"; (4) "01" when "S21 S20" is "10, "Ir2" is "0" and "S3" is "0"; (5) "10" when "S21 S20" is "10", "Ir2" is "1" and "S3" is "1"; (6) "11" when "S21 S20" is "10", "Ir2" is "1" and "S3" is ""0"; (7) "01" even if "S3" is ""0" or "1" when "S21 S20" is "11" and "Ir2" is "0"; and (8) "10" even if "S3" is "0" or "1" when "S21 S20" is "11" and "Ir2" is "1".

Figure 7:
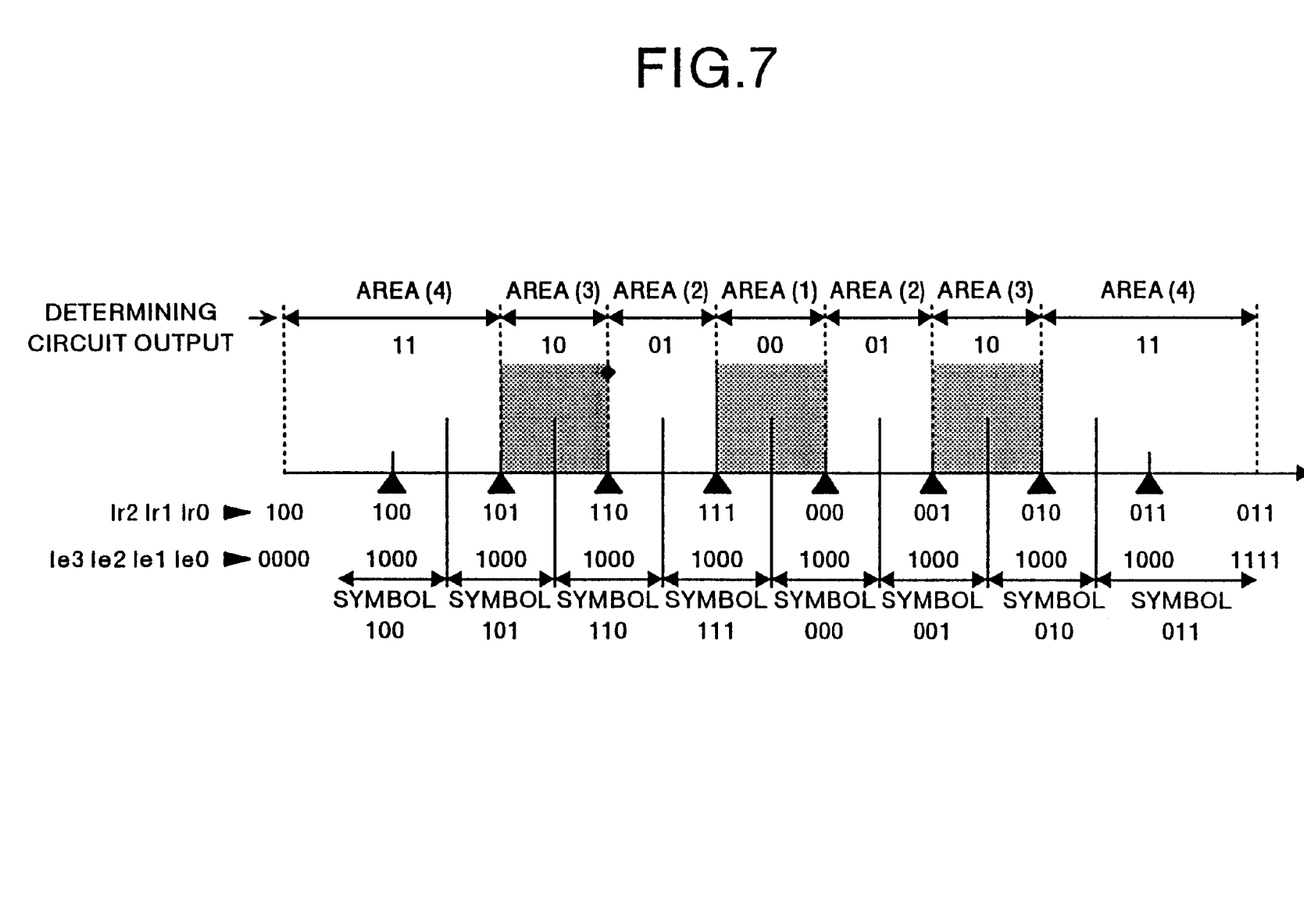
FIG. 7 is a simulated view showing a correlation between 64QAM-demodulated signals and QAM symbols in the Trellis decoder of present invention.

Accordingly, the high-order 2 bits in the demodulated signal, namely the high-order 2 bits "Ir2 Ir1" in the received symbol is identified by the output from the selection circuit 4. FIG. 7 is a simulative view showing a correlation between demodulated signals and QAM symbols, and as shown in this figure, the demodulated signal can be handled by dividing into four areas for eight symbols.

With the embodiment, the demodulated signal is handled by divided into four areas for eight symbols, a 3-bit sign is obtained according to the high-order 4-bit sign in the demodulated signal with the pre-circuit 1, and a 2-bit sign is obtained according to the 3-bit output from the pre-circuit 1 with the area determining circuit 2 to identify any one of the four areas. The 2-bit output from the area determining circuit and a sign for the MSB in the demodulated signal are delayed in the delay circuit 3, and then, the selection circuit 4 identifies a value for the high-order two bits in the received symbol according to the 2-bit output from the area determining circuit, the MSB in the demodulated signal and to the estimated value for the LSB in the received symbol outputted from the convolutional coder 6. Therefore, a number of bits for a sign inputted into the delay circuit 3 is total six bits, three bits each in the I axis and Q axis respectively.

The number of bits inputted into the delay circuit 3 is fewer as compared to eight bits, four bits each in the I axis and Q axis respectively based on the conventional technology, which allows reduction in the scale of the delay circuit 3. Accordingly, as a scale of the whole circuit in the Trellis decoder can be reduced, it is possible to make an area of an LSI smaller as well as the power consumption lower as compared to those based on the conventional technology.

It should be noted that the description in the embodiment has been made for each configuration of the pre-circuit 1, area determining circuit 2, and the selection circuit 4 with reference to the related drawings, but each of the components is not limited to the shown examples and may comprise other configuration, and for this reason, the present invention is also applicable in a trellis coding modulation system with 16QAM and 256QAM in addition to 64QAM.

As described above, with the present invention, a delay circuit receives a "X−1" bit sign outputted from the area determining circuit and a sign for the MSB in a demodulated signal, delays a sign for the X bits as a total of the bits above, and outputs the sign into the selection circuit, so that a number of bits inputted into the delay circuit is "2×X" bits as a total of X bits each in the I axis and Q axis respectively. The number of bits inputted into the delay circuit is fewer as compared to "(X−1)×4" (X>3) bits as a total of "(X−1)×2" bits each in the I axis and Q axis respectively based on the conventional technology. Therefore, a scale of the delay circuit can be made smaller, and accordingly, a scale of the whole circuit in a Trellis decoder can be reduced, which makes it possible to make an area of an LSI smaller as well as to realize lower power consumption as compared to those based on the conventional technology.

With the present invention, in a case of 64QAM, the delay circuit receives a 2-bit sign outputted from the area determining circuit and a sign for the MSB in a demodulated signal, delays a 3-bit sign as a total of the bits above, and outputs the sign to the selection circuit, so that a number of bits for a sign inputted into the delay circuit 3 is six bits as a total of three bits each in the I axis and Q axis respectively. The number of bits inputted into the delay circuit is fewer as compared to eight bits as a total of four bits each in the I axis and Q axis respectively based on the conventional technology. Therefore, scale of the delay circuit can be made smaller, and accordingly, as a scale of the whole circuit in a Trellis decoder can be reduced, it is possible to make an area of an LSI smaller as well as to realize lower power consumption as compared to those based on the conventional technology. With the present invention, in a case of 64QAM, a pre-circuit outputs a 3-bit sign according to a demodulated signal, the 3-bit sign is further converted into a 2-bit sign by the area determining circuit, and the 2-bit sign and a sign of the MSB in the demodulated signal is inputted into a delay circuit. Accordingly, a 6-bit sign as a total of three bits each in the I axis and Q axis respectively is inputted into the delay circuit, and the above bits are fewer than eight bits, so that a scale of the delay circuit can be made smaller. Moreover, as a scale of the whole circuit in a Trellis decoder can be reduced, it is possible to make an area of an LSI smaller as well as to realize lower power consumption as compared to those based on the conventional technology.

With the present invention, in a case of 64QAM, an area determining circuit outputs "00" when a demodulated signal is in a range from "0000000" to "0000111" or from "1111000" to "1111111", outputs "01" when a demodulated signal is in a range from "0001000" to "0010111" or from "1101000" to "1110111", outputs "10" when a demodulated signal is in a range from "0011000" to "0100111" or from "1011000" to "1100111" and outputs "11" when a demodulated signal is in a range from "0101000" to "1010111". Accordingly, a 6-bit sign as a total of three bits consisting of a 2-bit sign outputted from the area determining circuit and a sign for the MSB in the demodulated signal in the I axis and those in the Q axis is inputted into a delay circuit. These bits are fewer than eight bits, so that a scale of the delay circuit can be made smaller, and accordingly, as a scale of the whole circuit in a Trellis decoder can be reduced, it is possible to make an area of an LSI smaller as well as to realize lower power consumption as compared to those based on the conventional technology.

With the present invention, in a case of 64QAM, a selection circuit corrects an error for a value and identifies the high-order 2-bit sign in a received symbol according to the 2-bit sign outputted from an area determining circuit, the MSB in the received symbol, and the estimated sign for the LSB in the received symbol obtained through re-coding by the convolutional coder. Accordingly, a number of bits for a sign inputted into the delay circuit is six bits as a total of three bits consisting of a 2-bit sign outputted from the area determining circuit and a sign for the MSB in the demodulated signal in the I axis and those in the Q axis. These bits are fewer than eight bits based on the conventional technology, therefore, a scale of the delay circuit can be made smaller. Moreover, as a scale of the whole circuit in a Trellis decoder can be reduced, it is possible to make an area of an LSI smaller as well as to realize lower power consumption as compared to those based on the conventional technology.

This application is based on Japanese patent application No. HEI 10-242087 filed in the Japanese Patent Office on Aug. 27, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A Trellis decoder for demodulating a signal with a symbol therein subjected to modulation for trellis coding in a transmitting side to a signal expressed with N-bit two-valued signs (N: natural number not less than 4) for each of the I axis and Q axis and correcting an error in a received symbol expressed with an X-bit sign from a most significant bit to a X-th bit (X: natural number not less than 3 and smaller than N) from the high order bit in the demodulated signal, said Trellis decoder comprising:

a pre-circuit for outputting any of "X-power of 2" number of signs each expressed with X bits and different from each other according to a sign for "X+1" bits from the most significant bit to the "X+1"th bit from the high order bit in the demodulated signal;

an area determining circuit for outputting any of "(X−1) power of 2" number of signs each expressed with "X−1" bits and different from each other according to a sign expressed with any X bits outputted from said pre-circuit;

a Viterbi decoder for correcting an error for a value of a sign for a least significant bit in the received symbol;

a convolutional coder for executing recoding according to a result of error correction by said Viterbi decoder and outputting an estimated value of a sign for the least significant bit in the received symbol obtained by the operation for convolution;

a selection circuit for identifying a value of a sign for the "X−1" bit from the most significant bit to the "X−1"th bit from the high order bit in the received symbol according to a sign of "X+1" bits consisting of a sign of any "X−1" bits outputted from said area determining circuit, a sign of the most significant bit in the received symbol, and a 1-bit sign outputted from said convolutional coder; and a delay circuit for receiving a sign for any "X−1" bits outputted from said area determining circuit and a sign for the most significant bit in the demodulated signal and inputting a sign for the X bits as a total of the bits above into said selection circuit in synchronism to the 1-bit sign outputted from said convolutional coder.

2. A Trellis decoder according to claim 1; wherein said X is 3, and said pre-circuit outputs any of "111", "110", "101", "100", "011", "010", "001" and "000" according to a sign for the high order four bits in the demodulated signal; and said area determining circuit outputs any of "11", "10", "01" and "00" according to a 3-bit sign outputted from said pre-circuit.

3. A Trellis decoder according to claim 2; wherein said N is 7, and said pre-circuit outputs any of the following (1) to (8):

(1) "000" when a demodulated signal is in a range from "0000000" to "0000111" or from "1111000" to "1111111", (2) "001" when a demodulated signal is in a range from "0001000" to "0001111" or from "1110000" to "1110111", (3) "010" when a demodulated signal is in a range from "0010000" to "0010111" or from "1101000" to "1101111", (4) "011" when a demodulated signal is in a range from "0011000" to "0011111" or from "1100000" to "1100111", (5) "100" when a demodulated signal is in a range from "0100000" to "0100111" or from "1011000" to "1011111", (6) "101" when a demodulated signal is in a range from "0101000" to "0101111" or from "1010000" to "1010111", (7) "110" when a demodulated signal is in a range from "0110000" to "0110111" or from "1001000" to "1001111" and (8) "111" when a demodulated signal is in a range from "0111000" to "1000111".

4. A Trellis decoder according to claim 3; wherein said area determining circuit outputs any of the following (1) to (4):

(1) "00" when output of said pre-circuit is "000", (2) "01" when output of said pre-circuit is "001" or "010", (3) "10" when output of said pre-circuit is "011" or "100" and
(4) "11" when output of said pre-circuit is "101", "110", or "111".

5. A Trellis decoder according to claim 4; wherein said selection circuit outputs any of the following (1) to (8):

(1) "00" when output of said area determining circuit is "00" or "01" and the most significant bit in a received symbol is "0",
(2) "11" when output of said area determining circuit is "00" or "01" and the most significant bit in a received symbol is "1",
(3) "00" when output of said area determining circuit is "10", the most significant bit in a received symbol is "0" and output of said convolutional coder is "1",
(4) "01" when output of said area determining circuit is "10", the most significant bit in a received symbol is "0" and output of said convolutional coder is "0",
(5) "10" when output of said area determining circuit is "10", the most significant bit in a received symbol is "1" and output of said convolutional coder is "1",
(6) "11" when output of said area determining circuit is "10", the most significant bit in a received symbol is "1" and output of said convolutional coder is "0",
(7) "01" when output of said area determining circuit is "11" and the most significant bit in a received symbol is "0" and
(8) "10" when output of said area determining circuit is "11" and the most significant bit in a received symbol is "1".

* * * * *